United States Patent
Vinn et al.

(10) Patent No.: US 6,441,682 B1
(45) Date of Patent: Aug. 27, 2002

(54) ACTIVE POLYPHASE FILTER WITH TRANSCONDUCTOR CROSS-COUPLING OF FILTER SECTIONS

(75) Inventors: Charles Vinn, Milpitas, CA (US); Gwilym Luff, Great Shelford (GB); Carlos Laber, Los Altos, CA (US)

(73) Assignee: Micro Linear Corporation, San Jose, CA (US)

( * ) Notice: Subject to any disclaimer, the term of this patent is extended or adjusted under 35 U.S.C. 154(b) by 0 days.

(21) Appl. No.: 09/721,370

(22) Filed: Nov. 22, 2000

Related U.S. Application Data
(60) Provisional application No. 60/167,557, filed on Nov. 23, 1999.

(51) Int. Cl.[7] .................................................. H04B 1/10
(52) U.S. Cl. ........................ 327/552; 327/558; 327/379
(58) Field of Search ................................ 327/551, 552, 327/553, 558, 363, 379; 330/106, 107, 305

(56) References Cited

U.S. PATENT DOCUMENTS

| | | | |
|---|---|---|---|
| 4,141,209 A | 2/1979 | Barnett et al. | ............... 58/23 A |
| 4,350,957 A | 9/1982 | Miyamoto | ................... 329/107 |
| 4,723,318 A | * 2/1988 | Marshall | ..................... 455/109 |
| 4,823,092 A | * 4/1989 | Pennock | ..................... 330/253 |
| 4,918,338 A | * 4/1990 | Wong | ......................... 327/553 |
| 5,182,477 A | * 1/1993 | Yamasaki et al. | .............. 327/65 |
| 5,245,565 A | 9/1993 | Petersen et al. | ............. 364/825 |
| 5,303,420 A | 4/1994 | Jang | ............................ 455/343 |

(List continued on next page.)

FOREIGN PATENT DOCUMENTS

| | | | |
|---|---|---|---|
| EP | 0 344 852 A1 | 12/1989 | ........... H03H/11/04 |
| EP | 0 576 082 A1 | 12/1993 | ............ H04B/1/26 |
| EP | 0 660 504 A1 | 6/1995 | ............ H03B/5/12 |
| EP | 0 723 335 A1 | 7/1996 | ............ H03J/7/02 |
| EP | 0 833 482 A2 | 4/1998 | ......... H04L/27/233 |
| EP | 0 948 129 A1 | 10/1999 | ............ H03D/7/18 |
| GB | 2330 279 A | 4/1999 | ........... H04L/27/14 |

OTHER PUBLICATIONS

Hidehiko Kuraoda et al., "Development of Low–Power Consumption RF/IF Single–Chip Transceiver IC for PHS," Doc. No. XP–000832839, pp. 161–167, Compound Semiconductor Device Division, NEC IC Microcomputer Systems, Ltd.

Angel Boveda et al., "GaAs Monolithic Single–Chip Transceiver," Doc. No. XP–000538492, pp. 31–34, IEEE, May 15, 1995.

*Primary Examiner*—Timothy P. Callahan
*Assistant Examiner*—Hai L. Nguyen
(74) *Attorney, Agent, or Firm*—Haverstock & Owens LLP

(57) ABSTRACT

The invention is an improved implementation of an active-RC polyphase band-pass filter with transconductor cross-coupling between filter sections. The polyphase filter has first to fourth inputs, first to fourth outputs, two filter sections, and a block of transconductor pairs. The four input signals to the polyphase filter succeed one another in phase by 90 degrees. The two filter sections have reactances comprised of active balanced operational amplifiers with matched capacitors in their feedback loops. The block of transconductor pairs is coupled between corresponding reactances of each filter. The transconductance of each transconductor pair is set as the product of a desired radian center frequency and the capacitance of the corresponding matched capacitors. In the preferred embodiment, the transconductors are Gm cells and the transconductance of at least one Gm cell is field adjustable. The filter sections of the preferred embodiment can be a pair of low-pass third-order active-RC gaussian filters or a pair of low-pass sixth-order active-RC gaussian filters.

14 Claims, 23 Drawing Sheets

U.S. PATENT DOCUMENTS

| | | | |
|---|---|---|---|
| 5,345,190 A | * | 9/1994 | Kaylor .................. 330/258 |
| 5,353,307 A | | 10/1994 | Lester et al. .............. 375/14 |
| 5,491,447 A | * | 2/1996 | Goetschel et al. ......... 330/254 |
| 5,680,072 A | * | 10/1997 | Vulih et al. .............. 327/554 |
| 5,734,294 A | * | 3/1998 | Bezzam et al. ........... 327/552 |
| 5,764,171 A | * | 6/1998 | Stikvoort ................ 341/143 |
| 5,936,474 A | | 8/1999 | Rousselin ................ 331/34 |
| 5,953,640 A | | 9/1999 | Meador et al. ............ 455/73 |
| 6,049,573 A | * | 4/2000 | Song ..................... 375/316 |
| 6,060,935 A | * | 5/2000 | Shulman ................ 327/345 |

\* cited by examiner ically clockwise from the top left. The input voltage Vin is applied across N1 and N4. The output voltage Vout is measured across N3 and N4. A first resistor RP1 is connected between N1 and N2. A first capacitor CP1 is connected between N2 and N4. An inductor LP1 is connected between N2 and N3. A second capacitor CP2 and a second resistor RP2 are connected in parallel across N3 and N4.

ACTIVE POLYPHASE FILTER WITH TRANSCONDUCTOR CROSS-COUPLING OF FILTER SECTIONS

CROSS-REFERENCE TO RELATED APPLICATIONS:

This application claims priority of provisional application Ser. No. 60/167,557, filed Nov. 23, 1999, entitled QUADRATURE BANDPASS FILTER COMBINING RC LEAPFROG & GM-C TECHNIQUES, which is incorporated herein by reference.

FIELD OF INVENTION

The present invention relates to the field of active polyphase filter design. More particularly, the invention relates to the use of transconductors to cross-couple active polyphase filters sections.

BACKGROUND OF THE INVENTION

Polyphase filters receive an N-phase (or polyphase) input signal and create an N-phase output signal. A quadrature filter is a four-phase polyphase filter. In a quadrature filter, the input will consist of four signal voltages of mutually equal value. These four input signals jointly constituting a signal vector group with the individual signal vectors succeeding one another in a given direction of rotation through phase angles of 90 degrees. Dependent on direction of rotation, counter-clockwise or clockwise, the frequency of the polyphase signal is positive or negative. The I degree and 180 degree signal vectors are designated the +1 and –I signals. The 90 degree and 270 degree signal vectors are designated the +jQ and –jQ signals. Such a polyphase filter is known from the article "Asymmetric Polyphase Networks" by M. J. Gingell, published in "Electrical Communication", Vol. 48, no. 1 and 2, 1973, pp. 21–25.

Passive LC filters are limited by the difficulty of incorporating inductors into integrated circuits. To replace inductors and reduce sensitivity to component variations, active-RC filters were introduced. Operational amplifiers and, in some designs, gyrators are the reactances in an active-RC design. Active-RC filter circuits are easier to design and manufacture than passive filters. Feedback loops between the inputs and outputs of the active-RC reactances replace the need for inductive elements and reduce sensitivity to component variation.

The conversion of passive-LC filters designs to active-RC filter designs, termed "filter design," is the subject of many publications. Filter design begins with the choice of a passive filter. The most common types of passive filters are the gaussian, Butterworth, Bessel, and Chebyshev filters. The type of passive filter is chosen based upon its characteristics, such as ripple, stopband rejection, pole quality factor, noise figure, and sensitivity. The order of the filter, an indication of the number of poles in the filter, is also chosen. The choice of filter type and order is based on the constraints of the intended manufacturing process and end-use. After a filter type and order are chosen, nodal transfer functions (generally represented in Laplace notation) for the filter are derived. e nodal transfer functions allow a signal flow graph of the passive filter to be mapped. The noaltransfer functions of the passive filter are then replaced with active elements, resistors, and capacitors. The resulting active-RC filter network has a filter transfer function equivalent to the passive filter.

Three books that demonstrate filter design techniques are: (i) Handbook of Filter Synthesis, by Anatol I. Zverev, published 1967 by John Wiley & Sons; (ii) Electronic Filter Design Handbook, by Arthur B. Williams, published 1995 by McGraw Hill; and (iii) Analog MOS Integrated Circuits for Signal Processing, by Roubik Gregorian and Gabor C. Temes, published 1986 by John Wiley & Sons. In these books, schematics and tables of figures detail XT the configuration and component values for a broad range of filter types and orders. A detailed example of filter design can also be found in the following U.S. Patents: (i) "Symmetrical Polyphase Networks Utilizing Constant Reactances" by Michael John Gingell, number 3,618,133, issued 1971; and (ii) "Asymmetric Polyphase Filter" by Johannes O. Voorman, number 4,914,408, issued 1990 (hereafter "Voorman Patent"). Computer programs for filter design are also available.

An example of filter design is illustrated in FIGS. 1A and 1B. FIG. 1A shows a low-pass third-order passive LC filter 1 with four nodes, N1, N2, N3, and N4, numbered sequentially clockwise from the top left. The input voltage Vin is applied across N1 and N4. The output voltage Vout is measured across N3 and N4. A first resistor RP1 is connected between N1 and N2. A first capacitor CP1 is connected between N2 and N4. An inductor LP1 is connected between N2 and N3. A second capacitor CP2 and a second resistor RP2 are connected in parallel across N3 and N4.

FIG. 1B shows a low-pass third-order active-RC filter block (hereafter "FB") that approximates the transfer function of the low-pass third-order passive LC filter shown in FIG. 1A. FB includes: two input terminals IA and IB; two output terminals OA and OB; three reactances X1, X2, and X3; and fourteen matched resistors R. Each reactance is an active balanced integrating circuit than includes: one balanced differential amplifier 2, a reactance input pair 3; a reactance output pair 4; and a matched capacitor pair C1, C2, and C3. In each matched capacitor pair: one capacitor is shunted between the first input of a reactance input pair 3 and the first output of the reactance output pair 4; and the other capacitor is shunted between the second input of the reactance input pair 3 and the second output of the reactance output pair 4.

The internal nodes of FB can be identified by their associated terminal 5, as set forth in below Table I below.

TABLE 1

FB Nodes Identified by Terminal Number

| Reactance | First/Second | Input/Output | Terminal |
|---|---|---|---|
| X1 | second | input | T1A |
| X1 | first | input | T1B |
| X1 | second | output | T1C |
| X1 | first | output | T1D |
| X2 | second | output | T2A |
| X2 | first | output | T2B |
| X2 | first | input | T2C |
| X2 | second | input | T2D |
| X3 | second | input | T3A |
| X3 | first | input | T3B |
| X3 | second | output | T3C |
| X3 | first | output | T3D |

Note also that output terminal OA is attached to terminal T3C and that output OB is attached to terminal T3D. The Table II netlist below indicates the location of the fourteen matched resistors R. In table II, one matched resistor R is connected between the first node and the second node.

TABLE II

Resistors Connected Within FB

| First Node | Second Node |
|---|---|
| IA | T1A |
| IB | T1B |
| T1A | T2A |
| T1B | T2B |
| T1C | T2C |
| T1D | T2D |
| T2A | T3A |
| T2B | T3B |
| T2C | T3C |
| T2D | T3D |
| T1A | T1C |
| T1B | T1D |
| T3A | T3C |
| T3B | T3D |

While resistors R are shunted across X1 and X3, no resistors R are shunted across X2.

FIG. 1C shows a block diagram of FB. The block diagram has two inputs IA and IB. The block diagram has two outputs OA and OB. The block diagram also has three sets of four-lead terminals T1–T3 for a total of twelve terminals. The first set is labeled T1 and is composed of four terminals T1A, T1B, T1C, and T1D. The second set is labeled T2 and is composed of four terminals T2A, T2B, T2C, and T2D. The third set is labeled T3 and is composed of four terminals T3A, T3B, T3C, and T3D. Figure 1C also demonstrates how FB can be attached to a 2-phase input +Iin and −Iin, by input terminals IA and IB respectively, to generate a 2-phase output +Iout and −Iout, through output terminals OA and OB respectively.

A second example of filter design is shown in FIGS. 1D and 1E. FIG. 1D shows a low-pass sixth-order passive LC filter 6 with six nodes, NZ1, NZ2, NZ3, NZ4, NZ5, and NZ6, numbered sequentially clockwise from the top left. The input voltage Vzin is applied across NZ1 and NZ6. The output voltage Vzout is measured across NZ5 and NZ6. A first resistor RPZ1 is connected between NZ1 and NZ2. A first capacitor CPZ1 is connected between NZ2 and NZ6. A first inductor LPZ1 is connected between NZ2 and NZ3. A second capacitor CPZ2 is connected between NZ3 and NZ6. A second inductor LPZ2 is connected between NZ3 and NZ4. A third capacitor CPZ3 is connected between NZ4 and NZ6. A third inductor LPZ3 is connected between NZ4 and NZ5. A second resistor RPZ2 is connected between NZ5 and NZ6.

FIG. 1E shows a low-pass sixth-order active-RC filter block (hereafter "FBZ") that approximates the transfer function of the low-pass sixth-order passive LC filter shown in FIG. 1D. FBZ includes: two input terminals IZA and IZB; two output terminals OZA and OZB; six reactances XZ1, XZ2, XZ3, XZ4, XZ5, and XZ6; and twenty-six matched resistors RZ. Each reactance is an active balanced integrating circuit than includes: one balanced differential amplifier 2, a reactance input pair 3; a reactance output pair 4; and a matched capacitor pair CZ1, CZ2, CZ3, CZ4, CZ5, and CZ6. In each matched capacitor pair: one capacitor of each matched pair is shunted between the first input of a reactance input pair 3 and the first output of the reactance output pair 4; and the other capacitor is shunted between the second input of the reactance input pair 3 and the second output of the reactance output pair 4.

The internal nodes of FBZ can be identified by their associated terminal 5, as set forth in Table III below.

TABLE III

FBZ Nodes Identified by Terminal Number

| Reactance | First/Second | Input/Output | Terminal |
|---|---|---|---|
| XZ1 | second | input | TZ1A |
| XZ1 | first | input | TZ1B |
| XZ1 | second | output | TZ1C |
| XZ1 | first | output | TZ1D |
| XZ2 | second | output | TZ2A |
| XZ2 | first | output | TZ2B |
| XZ2 | first | input | TZ2C |
| XZ2 | second | input | TZ2D |
| XZ3 | second | input | TZ3A |
| XZ3 | first | input | TZ3B |
| XZ3 | first | output | TZ3C |
| XZ3 | second | output | TZ3D |
| XZ4 | second | output | TZ4A |
| XZ4 | first | output | TZ4B |
| XZ4 | first | input | TZ4C |
| XZ4 | second | input | TZ4D |
| XZ5 | second | input | TZ5A |
| XZ5 | first | input | TZ5B |
| XZ5 | second | output | TZ5C |
| XZ5 | first | output | TZ5D |
| XZ6 | second | output | TZ6A |
| XZ6 | first | output | TZ6B |
| XZ6 | first | input | TZ6C |
| XZ6 | second | input | TZ6D |

Note also that the output terminal OZA is attached to TZ6A and that the output terminal OZB is attached to TZ6B. The Table IV netlist below indicates the location of the twenty-six matched resistors RZ. In the table, one matched resistor RZ is connected between the first node and the second node.

TABLE IV

Resistors Connected Within FBZ

| First Node | Second Node |
|---|---|
| IZA | TZ1A |
| IZB | TZ1B |
| TZ1A | TZ2A |
| TZ1B | TZ2B |
| TZ1C | TZ2C |
| TZ1D | TZ2D |
| TZ2A | TZ3A |
| TZ2B | TZ3B |
| TZ2C | TZ3C |
| TZ2D | TZ3D |
| TZ3A | TZ4A |
| TZ3B | TZ4B |
| TZ3C | TZ4C |
| TZ3D | TZ4D |
| TZ4A | TZ5A |
| TZ4B | TZ5B |
| TZ4C | TZ5C |
| TZ4D | TZ5D |
| TZ5A | TZ6A |
| TZ5B | TZ6B |
| TZ5C | TZ6C |
| TZ5D | TZ6D |
| TZ1A | TZ1C |
| TZ1B | TZ1D |
| TZ6A | TZ6D |
| TZ6B | TZ6C |

While resistors RZ are shunted across XZ1 and XZ6, no resistors RZ are shunted across XZ2, XZ3, XZ4, or XZ5.

FIG. 1F shows a block diagram of FBZ. The block diagram has two inputs IZA and IZB. The block diagram has two output terminals OZA and OZB. The block diagram also has six sets of four-lead terminals for a total of twenty-four terminals. The first set is labeled TZ1 and is composed of four terminals TZ1A, TZ1B, TZ1C, and TZ1D. The second set is labeled TZ2 and is composed of four terminals TZ2A, TZ2B, TZ2C, and TZ2D. The third set is labeled TZ3 and is composed of four terminals TZ3A, TZ3B, TZ3C, and TZ3D.

The fourth set is labeled TZ4 and is composed of four terminals TZ4A, TZ4B, TZ4C, and TZ4D. The fifth set is labeled TZ5 and is composed of four terminals TZ5A, TZ5B, TZ5C, and TZ5D. The sixth set is labeled TZ6 and is composed of four terminals TZ6A, TZ6B, TZ6C, and TZ6D. FIG. 1F also demonstrates how FBZ receives a 2-phase input +Iin and −Iin, by input terminals IZA and IZB respectively, to generate a 2-phase output signal +Iout and −Iout, through output terminals OZA and OZB respectively.

FIGS. 2A and 2B demonstrate how low-pass quadrature filters can be constructed from a first filter section 7 for the I signals and a second filter section 8 for the Q signals. FIG. 2A shows a first filter section FB and a second filter section FB'. Both FB and FB' are identical to the third-order low-pass active RC filter illustrated in FIGS. 1B and 1C. The first filter section FB is attached to a 2-phase input +Iin and −Iin, by FB input terminals IA and IB respectively, to generate a 2-phase output +Iout and −Iout, through FB output terminals OA and OB respectively. The second filter section FB' is attached to a 2-phase input +Qin and −Qin, by FB' input terminals IA' and IB' respectively, to generate a 2-phase output +Qout and −Qout, through FB' output terminals OA' and OA' respectively. The terminals of FB and FB' are not used in this configuration.

FIG. 2B shows a first filter section FBZ and a second filter section FBZ'. The first filter section FBZ and the second filter section FBZ' are both identical to the low-pass sixth-order active RC filter illustrated in FIGS. 1E and 1F. The first filter section FBZ is connected to inputs +Iin and −Iin by input terminals IZA and IZB, respectively, and to outputs +Izout and −Izout by ouput terminals OZA and OZB, respectively. The second filter section FBZ' is connected to inputs +Qin and −Qin by input terminals IZA' and IZB', respectively, and to outputs +Qzout and −Qzout by output terminals OZA' and OZB', respectively. The terminals of FBZ and FBZ' are not used in this configuration.

Though the circuit path for the I and Q signal inputs never intersect each other in the circuits shown in FIGS. 2A and 2B, the two filter sections perform as a low-pass sixth-order quadrature filter and low-pass twelfth-order quadrature filter, respectively. Since the bandpass of the quadrature filter includes both low positive frequencies and low negative frequencies, the quadrature filters shown in FIGS. 2A and 2B act like band-pass filters with a center frequency of zero hertz.

The Voorman Patent (U.S. Pat. No. 4,914,408) discloses that a quadrature band-pass filter can be created by cross-coupling the reactances of two filter sections with matched resistors. Application of this approach can be accomplished by shunting matched resistors between the terminals 5 of the first filter section FBZ and the terminals 5 of the second filter section FBZ'.

To simplify representation of the matched resistors, FIGS. 3A to 3D describe two resistor coupling blocks and their contents. FIG. 3A shows three sets of four matched resistors, R1, R2 and R3. Each resistor has a node on either end. The node netlist for each resistor is set forth in Table V below.

TABLE V

| Resistors Connected Between First Node and Second Node | | |
|---|---|---|
| First Node | Second Node | Matched Resistor |
| RC1A | RC1C' | R1 |
| RC1B | RC1D' | R1 |
| RC1C | RC1B' | R1 |
| RC1D | RC1A' | R1 |
| RC2A | RC1D' | R2 |
| RC2B | RC1C' | R2 |
| RC2C | RC1B' | R2 |
| RC2D | RC1A' | R2 |
| RC3A | RC1C' | R3 |
| RC3B | RC1D' | R3 |
| RC3C | RC1B' | R3 |
| RC3D | RC1A' | R3 |

FIG. 3B shows the resistor coupling block diagram labeled "R block." The R block has 24 leads. The leads are grouped into sets of four leads labeled RC1, RC2, RC3, RC1', RC2', and RC3'. Each set has an A, B, C, and D lead. RC1, for instance, has leads RC1A, RC1B, RC1C, and RC1D. And RC1' has leads RC1A', RC1B', RC1C', and RC1D'.

FIGS. 3C and 3D describe the resistor block for FBZ. FIG. 3B shows six sets of four matched resistors, RZ1, RZ2, RZ3, RZ4, RZ5, and RZ6. Each resistor has a node on either end. The node netlist for each resistor is set forth in Table VI below.

TABLE VI

| Resistors Connected Between First Node and Second Node | | |
|---|---|---|
| First Node | Second Node | Matched Resistor |
| RZC1A | RZC1C' | RZ1 |
| RZC1B | RZC1D' | RZ1 |
| RZC1C | RZC1B' | RZ1 |
| RZC1D | RZC1A' | RZ1 |
| RZC2A | RZC2D' | RZ2 |
| RZC2B | RZC2C' | RZ2 |
| RZC2C | RZC2B' | RZ2 |
| RZC2D | RZC2A' | RZ2 |
| RZC3A | RZC3D' | RZ3 |
| RZC3B | RZC3C' | RZ3 |
| RZC3C | RZC3B' | RZ3 |
| RZC3D | RZC3A' | RZ3 |
| RZC4A | RZC4D' | RZ4 |
| RZC4B | RZC4C' | RZ4 |
| RZC4C | RZC4B' | RZ4 |
| RZC4D | RZC4A' | RZ4 |
| RZC5A | RZC5C' | RZ5 |
| RZC5B | RZC5D' | RZ5 |
| RZC5C | RZC5B' | RZ5 |
| RZC5D | RZC5A' | RZ5 |
| RZC6A | RZC6D' | RZ6 |
| RZC6B | RZC6C' | RZ6 |
| RZC6C | RZC6B' | RZ6 |
| RZC6D | RZC6A' | RZ6 |

FIG. 3D shows the resistor coupling block diagram labeled "RZ block." The RZ block has forty-eight leads. The leads are grouped into sets of four leads labeled RZC1, RZC2, RZC3, RZC4, RZC5, RZC6, RZC1', RZC2', RZC3', RZC4', RZC5', and RZC6'. Each set has an A, C, and D lead.

FIGS. 4A shows a first filter section FB and a second filter section FB' coupled together through an R block. Excluding the addition and coupling of the R block, FIG. 4A shows the same quadrature filter configuration as in FIG. 2A. Corresponding R block leads are connected to the terminals of the first filter section FB and the section filter section FB'. RC1A and RC1A', for instance, are connected to T1A and T1A' respectively. The coupling of the first filter section FB to the second filter section FB' in FIG. 4B follows the same method as FIG. 4A, except that the RZ block is used to couple FBZ and FBZ'.

Coupling the filter sections of a low-pass quadrature filter changes the quadrature filter in two ways. First, the coupling reduces the quadrature filter's sensitivity to component variations between the first filter section FBZ and the second filter section FBZ'. As the I and Q signals share many components, component variations effects have approximately the same impact upon each signal's transfer function. A second result of the cross-coupling is that the center frequency of the quadrature filter is moved from zero hertz to a new center frequency. As disclosed in the Voorman Patent, the center frequency of the coupled filter is equal to $1/R_iC_i$, where $R_i$ is the value of an individual cross-coupling resistor between two corresponding reactances and $C_i$ is the capacitance of an single matched capacitor shunted between the input and output of the corresponding reactances. During design of integrated circuits containing these active quadrature band-pass filters, the center frequency can be adjusted by adjusting the value of $R_i$ and $C_i$.

The resistor cross-coupling disclosed in the Voorman Patent has some limitations. First, the center frequency cannot be altered post-manufacture, as resistors and capacitors are passive elements with non-adjustable values. Second, component variations between the first filter section and the second filter section can degrade output signal quality. The resistors are shunted across operational amplifiers, which are susceptible to variation in common mode voltage or DC offset voltage. A mismatch between corresponding operational amplifiers can result in larger than expected or smaller than expected currents through a coupling resistor. Larger than expected and smaller than expected currents can also result from component variations between matched capacitor and resistors.

SUMMARY OF THE INVENTION

The invention is an improved implementation of an active-RC polyphase band-pass filter with transconductor cross-coupling between filter sections. The polyphase filter has first to fourth inputs, first to fourth outputs, two filter sections, and a block of transconductor pairs. The four input signals to the polyphase filter succeed one another in phase by 90 degrees. The two filter sections have reactances comprised of active balanced operational amplifiers with matched capacitors in their feedback loops. Each transconductor pair of the block is coupled between corresponding reactances of each filter. The transconductance value of each transconductor pair is set as the product of a desired radian center frequency and the capacitance of the corresponding matched capacitors. In the preferred embodiment, the transconductors are Gm cells and the transconductance value of at least one Gm cell is field adjustable. This means that the transconductance value can be adjusted after the filter has been constructed or placed in service. The filter sections of the preferred embodiment can be a pair of low-pass, third-order, active-RC gaussian filters or a pair of low-pass sixth-order active-RC gaussian filters.

The first filter section has X-reactances and M-terminals. The second filter section has Y-reactances and N-terminals. The filter sections are coupled by the block of transductors with a total of M plus N terminals. The X-reactances are coupled to the first input, the third input, the first output, and the third output. The Y-reactances are coupled to the second input, the fourth input, the second output, and the fourth output of the output. The M-terminals are coupled to select ones of the X-reactances. The N-terminals are coupled to select ones of the Y-reactances. In the preferred embodiment: X and Y are equal and M and N are equal; one half of the M-terminals are coupled to reactance input terminal pairs of the first filter section and the other half are coupled to reactance output terminal pairs of the first filter section; and one half of the N-terminals are coupled to reactance input terminal pairs of the second filter section and the other half are coupled to reactance output terminal pairs of the second filter section.

The reactances of each filter section are comprised of active balanced integrating circuits. Each active balance integrating circuit has a balanced differential operational amplifier with matched capacitors in their feedback loop. The balanced differential operational amplifier has a reactance input terminal pair and a reactance output terminal pair. The first matched capacitor is shunted between the first input of the reactance input terminal pair and the first output of the reactance output terminal pair. The second matched capacitor is shunted between the second input terminal of the reactance input terminal pair and the second output of the reactance output terminal pair. The matched capacitors of the first to Xth reactance and the corresponding matched capacitors of the first to Yth reactance are of equal capacitance.

The block of transconductors is composed of Z-transconductor pairs composed of Gm cells. Each of the Z-transconductor pairs cross-couple a reactance of the first filter section through its M-terminals and the correspoding reactances of the second filter section through its N-terminals. Each Gm cell has one transconductor input terminal pair and one transconductor output terminal pair. The transconductance value of each Gm cell is set as the product of a desired radian center frequency and the capacitance of the nearest matched capacitors. In the preferred embodiment, the transconductance value of at least one Gm cell is field adjustable, permitting adjustment of the center frequency in the field.

In each Z-transconductor pair, one Gm cell is coupled by its transconductor input terminal pair to a reactance output terminal pair of a corresponding X-reactance through a selected pair of M-terminals and by its transconductor output terminal pair to a reactance input terminal pair of a corresponding Y-reactance through a selected pair of N-terminals. The second Gm cell in each Z-transconductor pair is coupled by its transconductor input terminal pair to a reactance output terminal pair of a corresponding Y-reactance through a selected pair of N-terminals and by its transconductor output terminal pair to a reactance input terminal pair of a corresponding X-reactance through a selected pair of M-terminals. As the inputs of each Gm cell are a differential voltage from a single reactance, variation in the common mode voltage or DC offset between the filter sections does not adversely affect the polyphase filter's transfer function.

DETAILED DESCRIPTION OF THE PREFERRED EMBODIMENT

The invention cross-couples a first 2-phase filter section and a second 2-phase filter section with transconductors to create a band-pass quadrature filter. This implementation reduces the filter's sensitivity to component variations and permits the center frequency of the filter to be field adjusted.

Figure 1A:
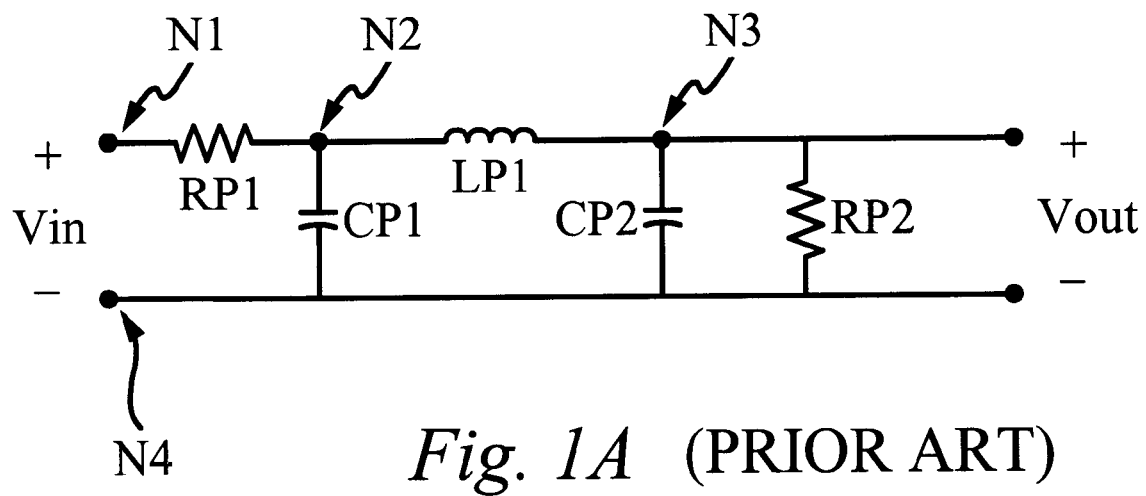
FIG. 1A is a schematic of a low-pass third-order passive LC filter.
Figure 1B:
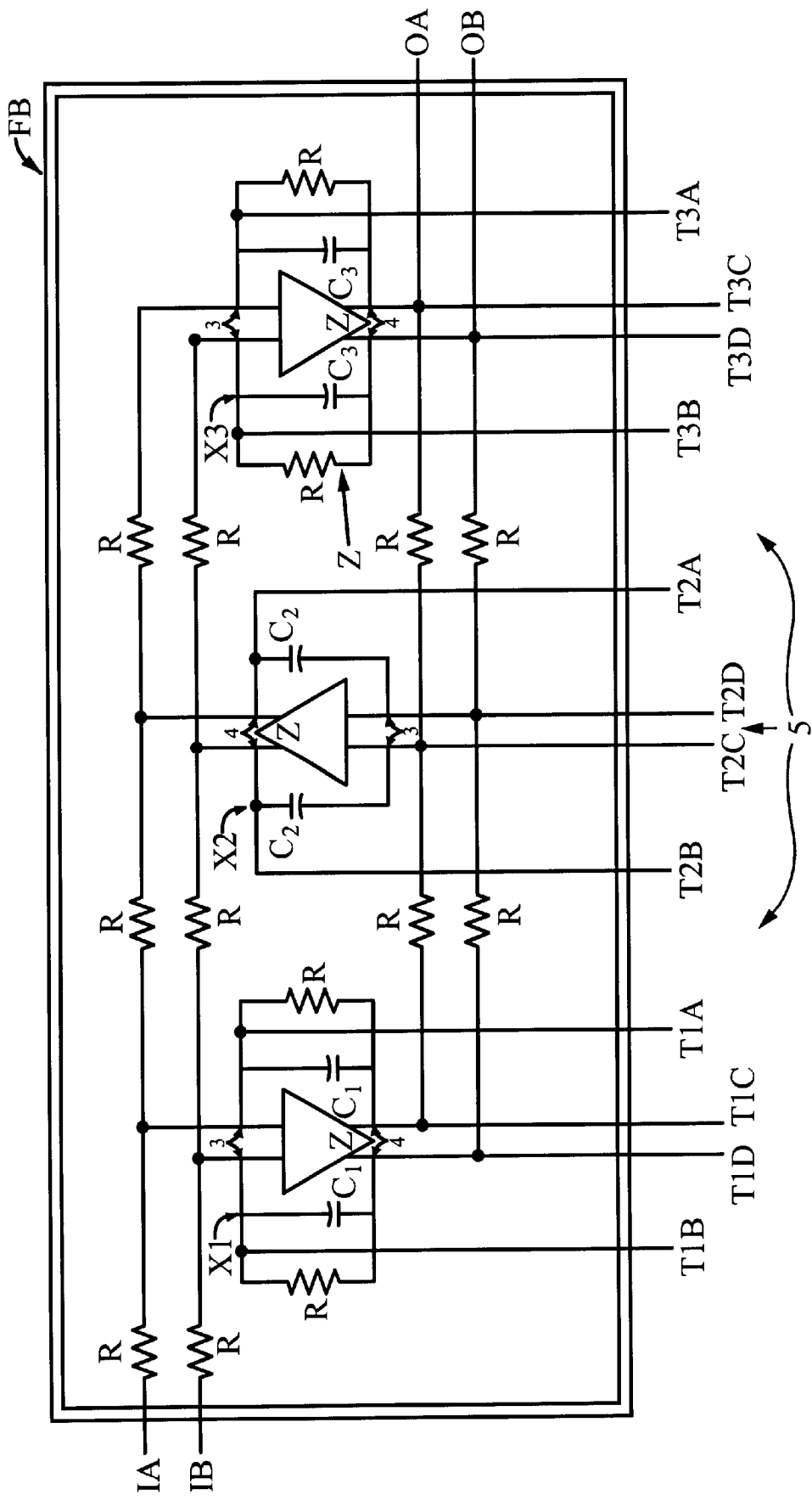
FIG. 1B is a schematic of an active-RC filter design of the low-pass third-order passive LC filter shown in FIG. 1A.
Figure 1C:
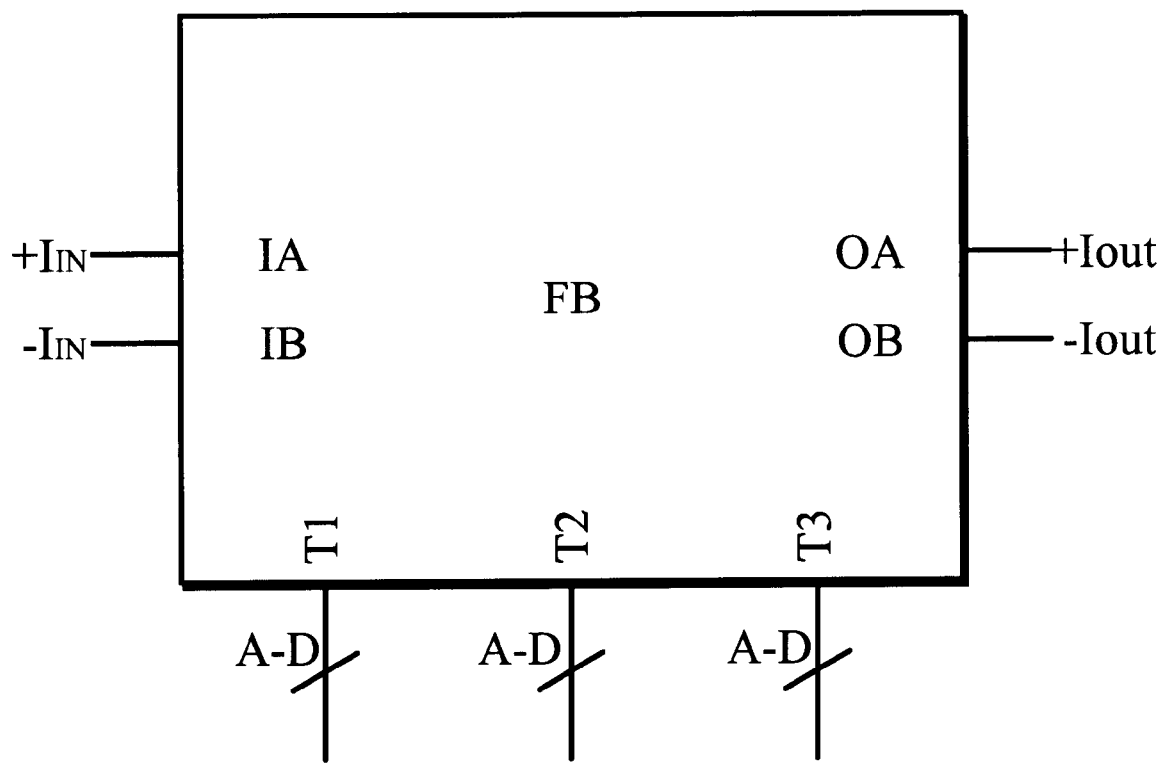
FIG. 1C is a block diagram of the low-pass third-order active-RC filter shown in FIG. 1B.
Figure 1D:
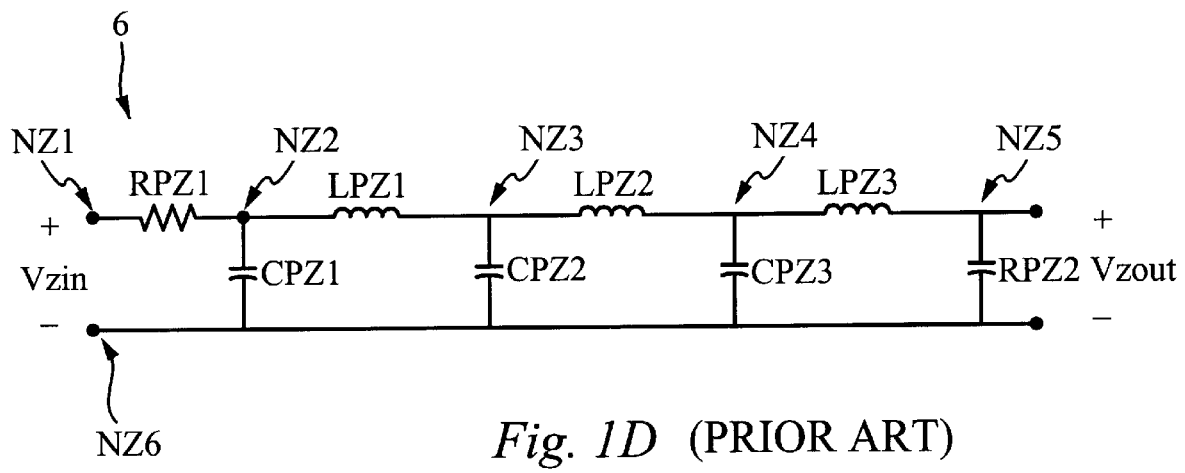
FIG. 1D is a schematic of a low-pass sixth-order passive LC filter.
Figure 1E:
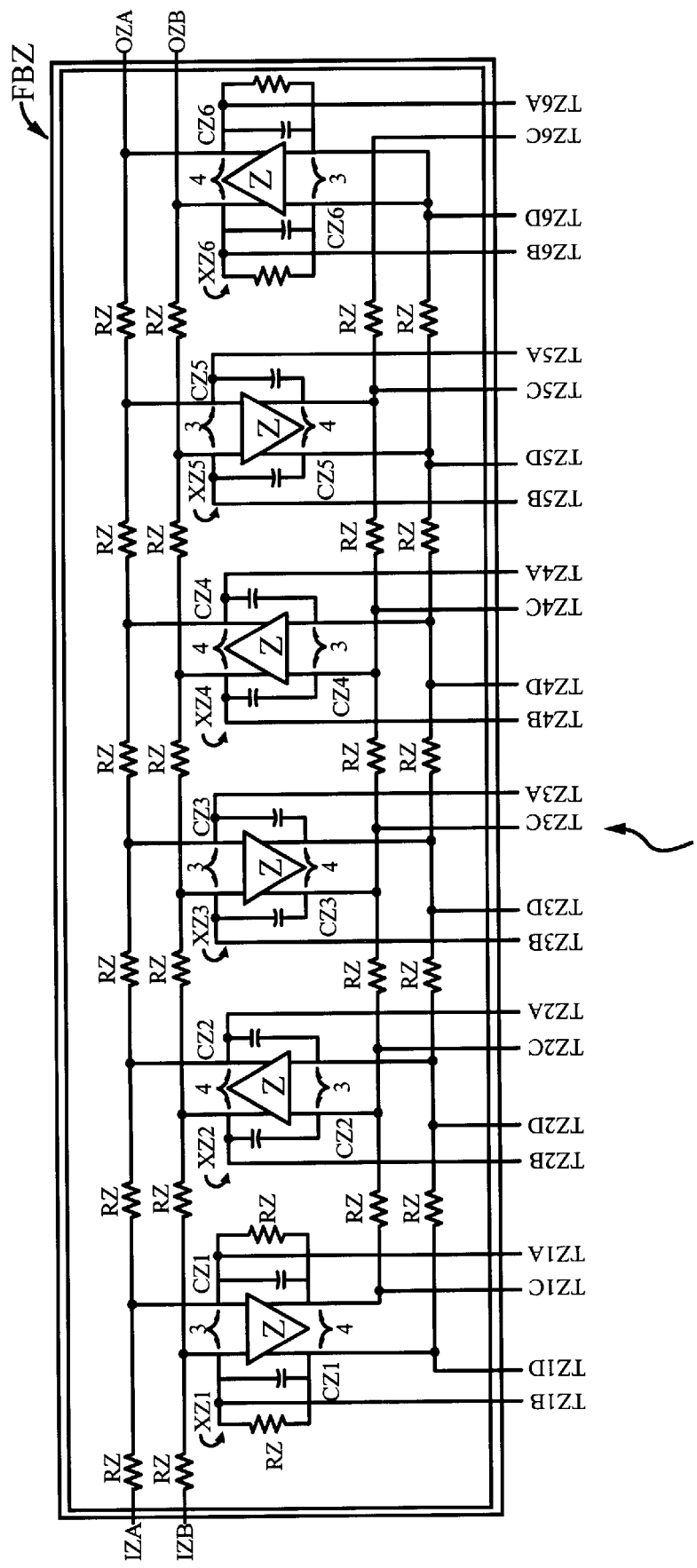
FIG. 1E is a schematic of an active-RC filter design of the low-pass sixth-order passive LC filter shown in FIG. 1D.
Figure 1F:
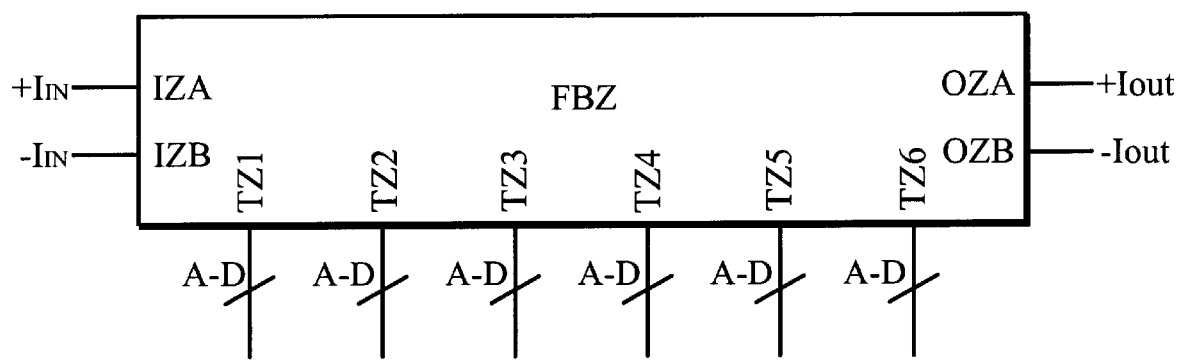
FIG. 1F is a block diagram of the low-pass sixth-order active-RC filter shown in FIG. 1E.
Figure 5A:
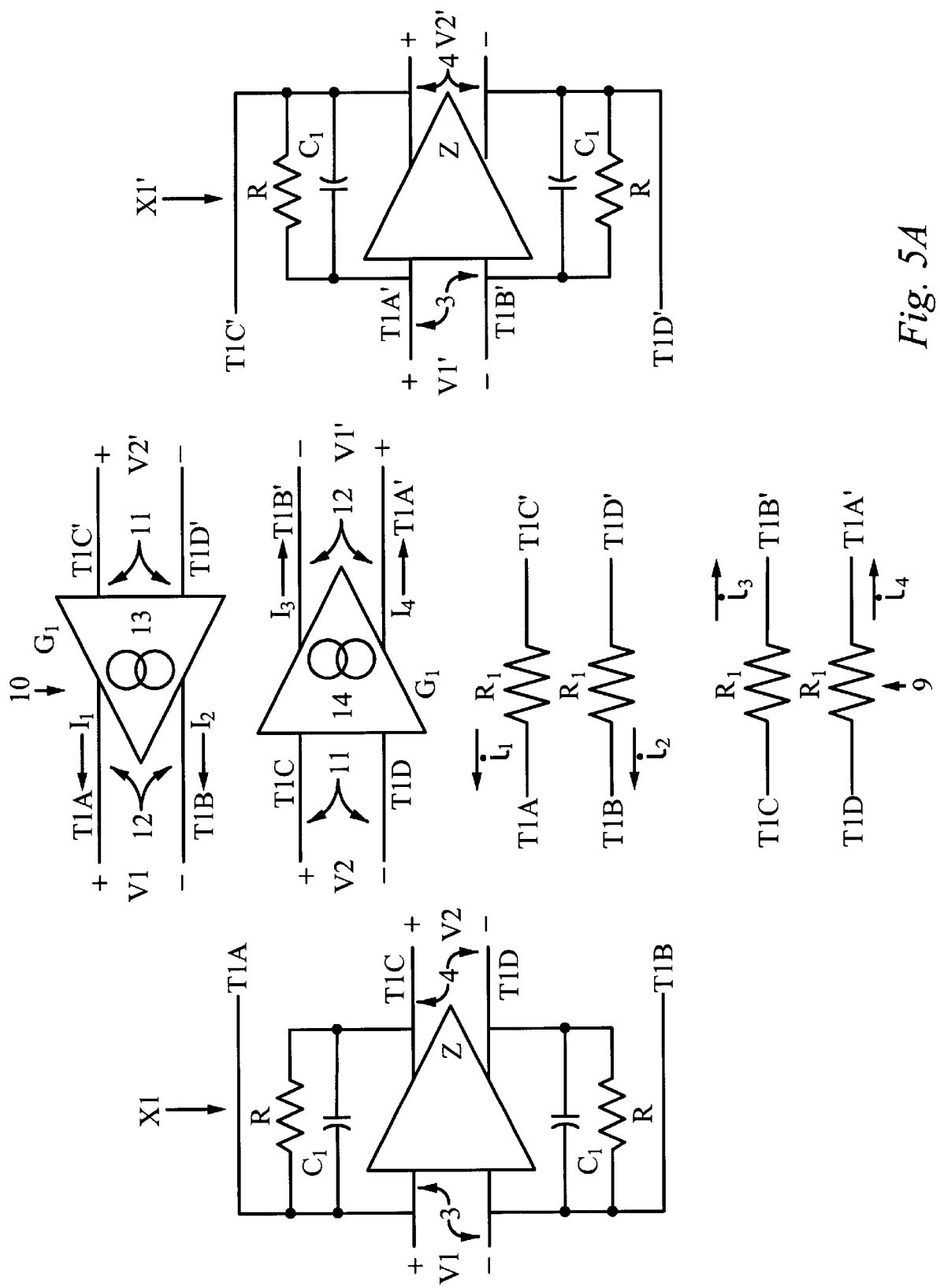
FIG. 5A is a schematic of a reactance from the first filter section, a reactance from the second filter section, a transconductor pair, and a set of resistors.

In the preferred embodiment of the present invention there is an interaction of paired reactances between the first filter section FB and the second filter section FB1. FIG. 5A shows four items: the first reactance of the first filter section, X1; the first reactance of the second filter section, X1'; the nodal connections between the matched resistors 9 and the two filter sections; and the nodal connections between the transconductors 10 and the two filter sections. Each reactance X1, X1' includes a balanced differential operational amplifier 2, a reactance input pair 3, a reactance output pair 4, and a feedback path between the output pairs and the input pairs. The feedback path consists of a resistor R and a matched capacitor C1 in parallel. The nodal connection information for the matched resistors 9 can be identified by their associated terminal 5 and by the node netlist. The nodal connection information for the transconductors is derived below. A view of X1 in the context of FB can be seen in FIG. 1B.

The transconductors each have a transconductor input terminal pair 11 and a transconductor output terminal pair 12. The first transconductor 13 receives its input signals from the reactance output pair of X1' and the second transconductor 14 receives its input signals from the reactance output pair of X1. The first transconductor 13 has two output currents, I1 and I2, and the second transconductor 14 has two output currents, I3 and I4. In the first transconductor 13, the voltage across the transconductor output terminal pair 12 is V1 and the voltage across the transconductor input terminal pair 11 is V2'. In the second transconductor 14, the voltage across the transconductor output pair 12 is V1' and the voltage across the transconductor input terminal pair 11 is V2. The transconductance of both transconductors is G1.

The transconductors 13, 14 shown in FIG. 5A, are operational transconductor amplifiers, also known as Gm cells. It is well known that Gm cells convert a differential voltage into proportional differential current. As used in the invention, the Gm cells create equivalent currents between the first filter section 7 and the second filter section 8. In FIG. 5A, the currents of the replaced resistors R1 are labeled i1, i2, i3, and i4. For the transconductors, 13 and 14, to properly replace the resistors R1: I1 should be equal to i1; I2 should be equal to i2; I3 should be equal to i3; and I4 should be equal to i4. The below Equation 1 and Equation 2 are derived from Ohm's Law. Equation 1 and Equation 2 state the differential current across the matched resistors 9. V1 and V1' are not variables in Equation 1 and Equation 2 because the feedback loop across each operational amplifier 2 drives V1 and V1' to a much smaller voltage than V2 and V2'.

$$i1-i2=V2'/R1 \qquad \text{Equation 1}$$

$$i3-i4=V2/R1 \qquad \text{Equation 2}$$

Gm cells operate according to the below equations, where Vd is the differential input voltage, G is the transconductance, and +Ig and −Ig are the differential output currents.

$$+Ig=(Vd \times G)/2 \qquad \text{Equation 3}$$

$$-Ig=-(Vd \times G)/2 \qquad \text{Equation 4}$$

Applying these equations to the FIG. 5A circuit elements we obtain:

$$I1-I2=V2' \times G1 \qquad \text{Equation 5}$$

$$I3-I4=V2 \times G1 \qquad \text{Equation 6}$$

If G1 is set equal to 1/R1, Equation 5 and Equation 6 become:

$$I1-I2=V2'/R1 \qquad \text{Equation 7}$$

$$I3-I4=V2/R1 \qquad \text{Equation 8}$$

Figure 5B:
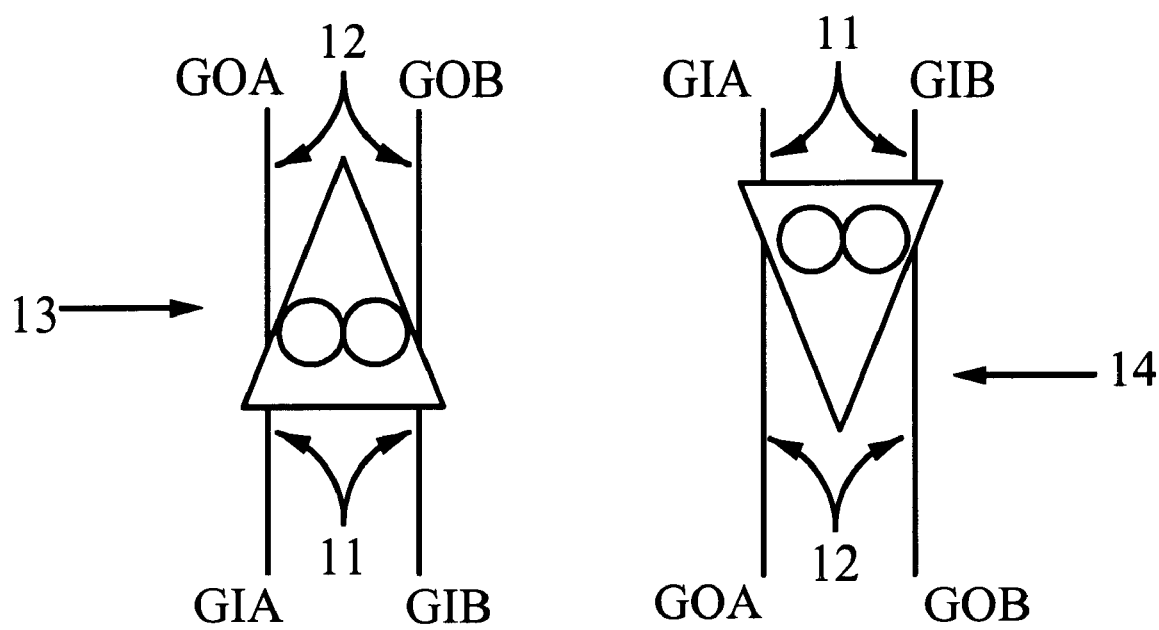
FIG. 5B is a schematic of a transconductor pair used in the coupling of FB pairs.
Figure 5C:
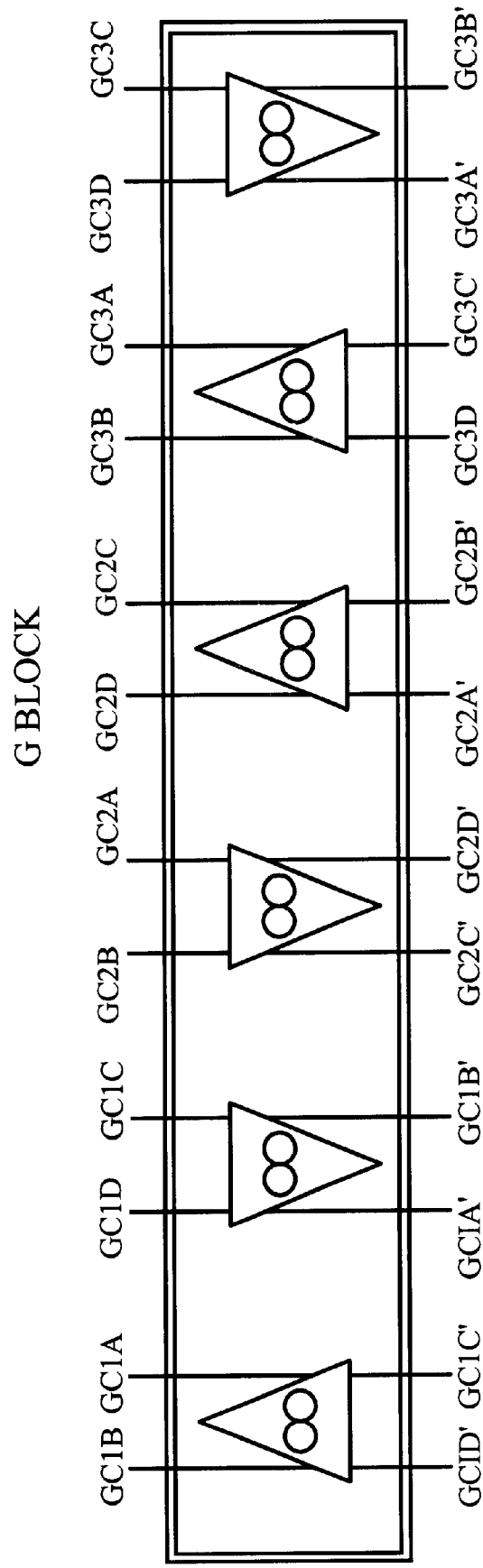
FIG. 5C is a schematic of a G block used in the coupling of FB pairs.
Figure 5D:
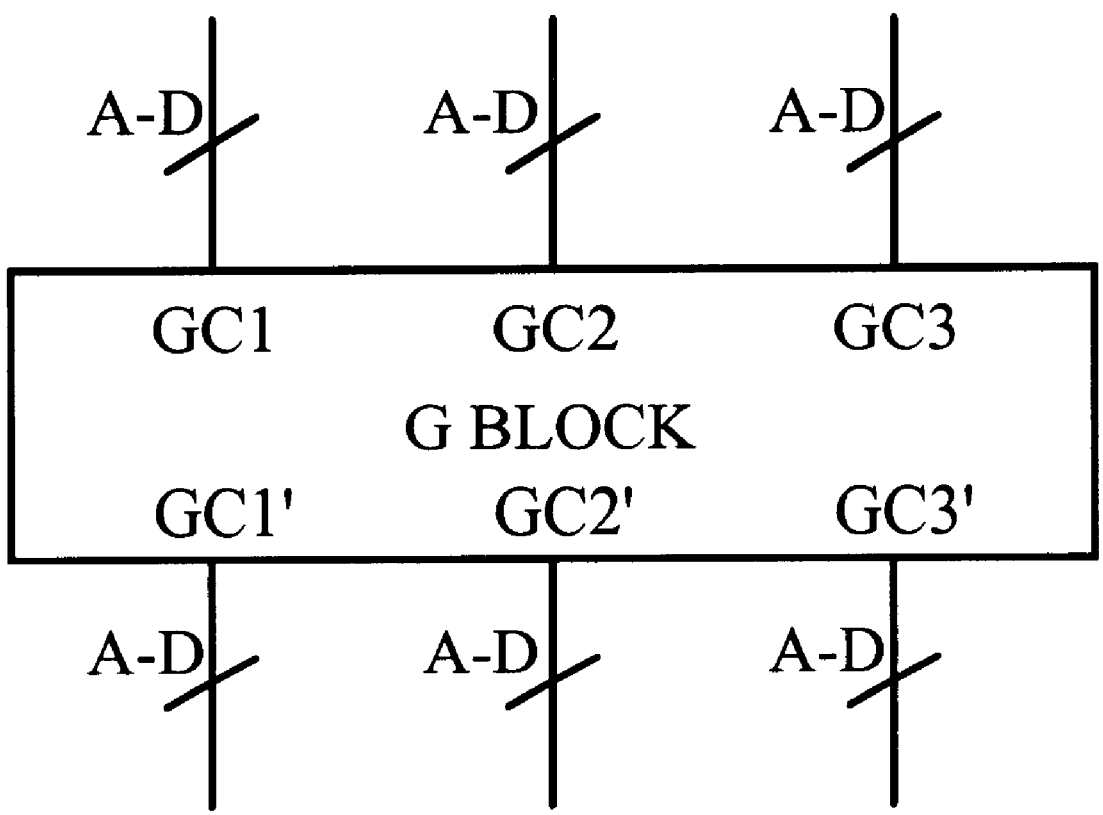
FIG. 5D is a block diagram of the G block shown in FIG. 5C.

To simplify representation of the Gm cells 13, 14, FIGS. 5B to 5D describe a Gm coupling block and its contents for a sixth-order band-pass quadrature filter. FIG. 5B shows a transconductor pair including a first transconductor 13 and a second transconductor 14. Each Gm cell has a transconductor input terminal pair 11, including input leads GIA and GIB, and a transconductor output terminal pair 12, including output leads GOA and GOB. FIG. 5C shows three sets of matched transconductor pairs 13, 14 with transconductance G1, G2, and G3. The node netlist for each Gm cell in FIG. 5C is set forth in Table VII below.

TABLE VII

| | | Gm Cell Connections | | |
|---|---|---|---|---|
| GIA | GIB | GOA | GOB | Matched Gm Cell |
| GC1D' | GC1C' | GC1B | GC1A | first G1 |
| GC1D | GC1C | GC1A' | GC1B' | second G1 |
| GC2B | GC2A | GC2C' | GC2D' | first G2 |
| GC2A' | GC2B' | GC2D | GC2C | second G2 |
| GC3D' | GC3C' | GC3B | GC2A | first G3 |
| GC3D | GC3C | GC3A' | GC3B' | second G3 |

FIG. 5D shows a transconductance coupling block diagram labeled "G block." The G block has twenty-four leads. The leads are grouped into sets of four leads labeled GC1, GC2, GC3, GC1', GC2', and GC3'. Each set has an A, B, C, and D lead. GC1, for instance, has leads GC1A, GC1B, GC1C, and GC1D. And GC1' has leads GC1A', GC1B', GC1C', and GC1D'.

Figure 5E:
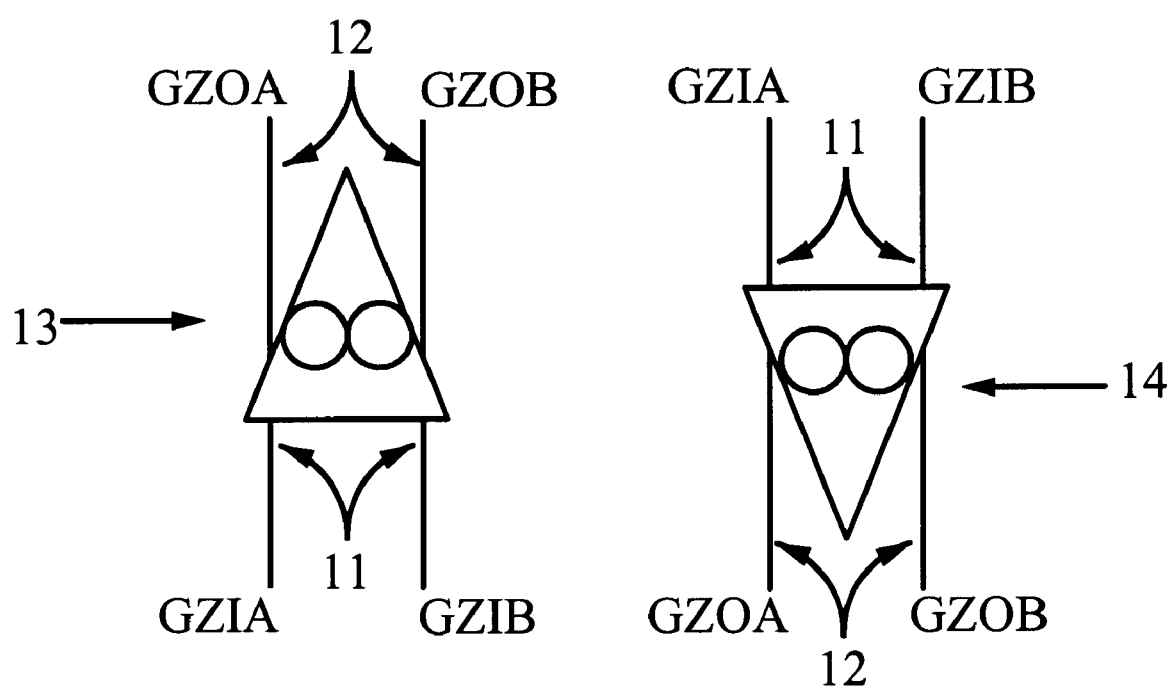
FIG. 5E is a schematic of a transconductor pair used in the coupling of FBZ pairs.
Figure 5F:
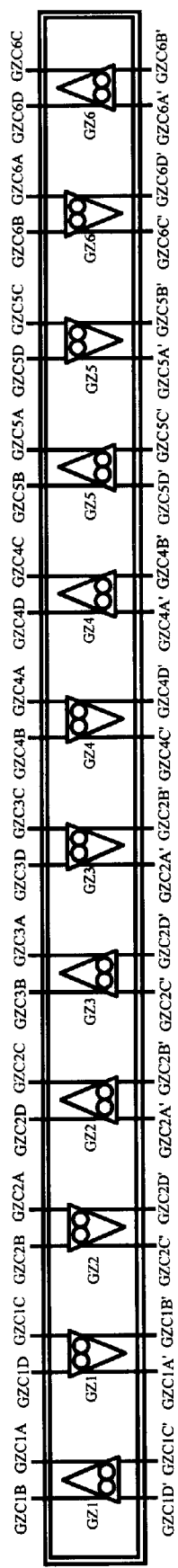
FIG. 5F is a schematic of a GZ block used in the coupling of FBZ pairs.
Figure 5G:
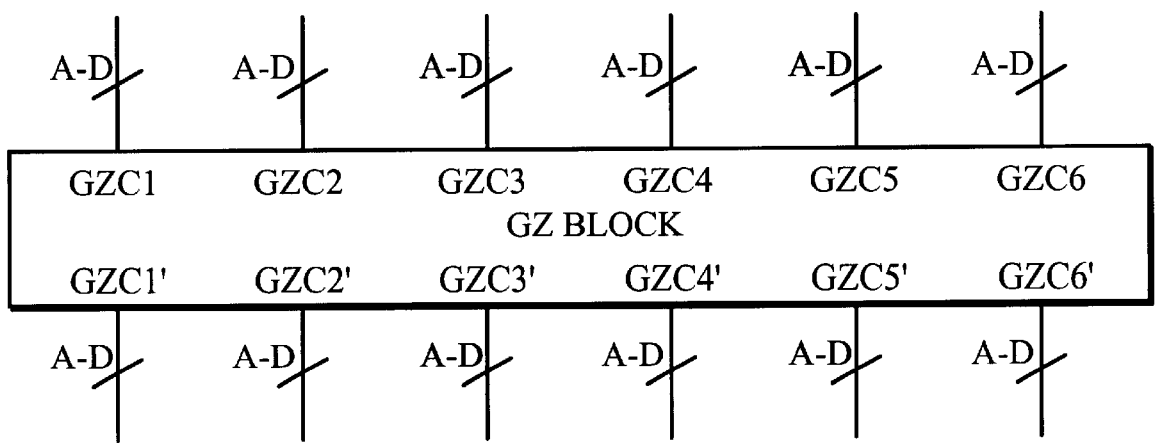
FIG. 5G is a block diagram of the GZ block shown in FIG. 5F.

FIGS. 5E to 5G describe a Gm coupling block and its contents for the sixth-order band-pass quadrature filter. FIG. 5E shows a transconductor pair with a first transconductor 13 and a second transconductor 14. Each Gm cell has a transconductor input pair 11, with input leads labeled GZIA and GZIB, and a transconductor output pair 12, with output leads labeled GZOA and GZOB. FIG. 5F shows six sets of matched transconductor pairs with transconductance GZ1, GZ2, GZ3, GZ4, GZ5, and GZ6. The node netlist for each Gm cell is set forth in Table VIII below.

TABLE VIII

| | | Gm Cell Connections | | |
|---|---|---|---|---|
| GZIA | GZIB | GZOA | GZOB | Matched Gm Cell |
| GZC1D' | GZC1C' | GZC1B | GZC1A | first GZ1 |
| GZC1D | GZC1C | GZC1A' | GZC1B' | second GZ1 |
| GZC2B | GZC2A | GZC2C' | GZC2D' | first GZ2 |
| GZC2A' | GZC2B' | GZC2D | GZC2C | second GZ2 |
| GZC3C' | GZC3D' | GZC3B | GZC3A | first GZ3 |
| GZC3D | GZC3C | GZC3A' | GZC3B' | second GZ3 |
| GZC4B | GZC4A | GZC4C' | GZC4D' | first GZ4 |
| GZC4A' | GZC4B' | GZC4D | GZC4C | second GZ4 |
| GZC5D' | GZC5C' | GZC5B | GZC5A | first GZ5 |
| GZC5D | GZC5C | GZC5A' | GZC5B' | second GZ5 |
| GZC6B | GZC6A | GZC6C' | GZC6D' | first GZ6 |
| GZC6A' | GZC6B' | GZC6D | GZC6C | second GZ6 |

FIG. 5G shows the transconductance coupling block diagram labeled "GZ block." The GZ block has forty-eight leads. The leads are grouped into sets of four leads labeled GZC1, GZC2, GZC3, GZC4, GZC5, GZC6, GZC1', GZC2', GZC3', GZC4', GZC5', and GZC6'. Each se an A, B, C, and D lead.

Figure 2A:
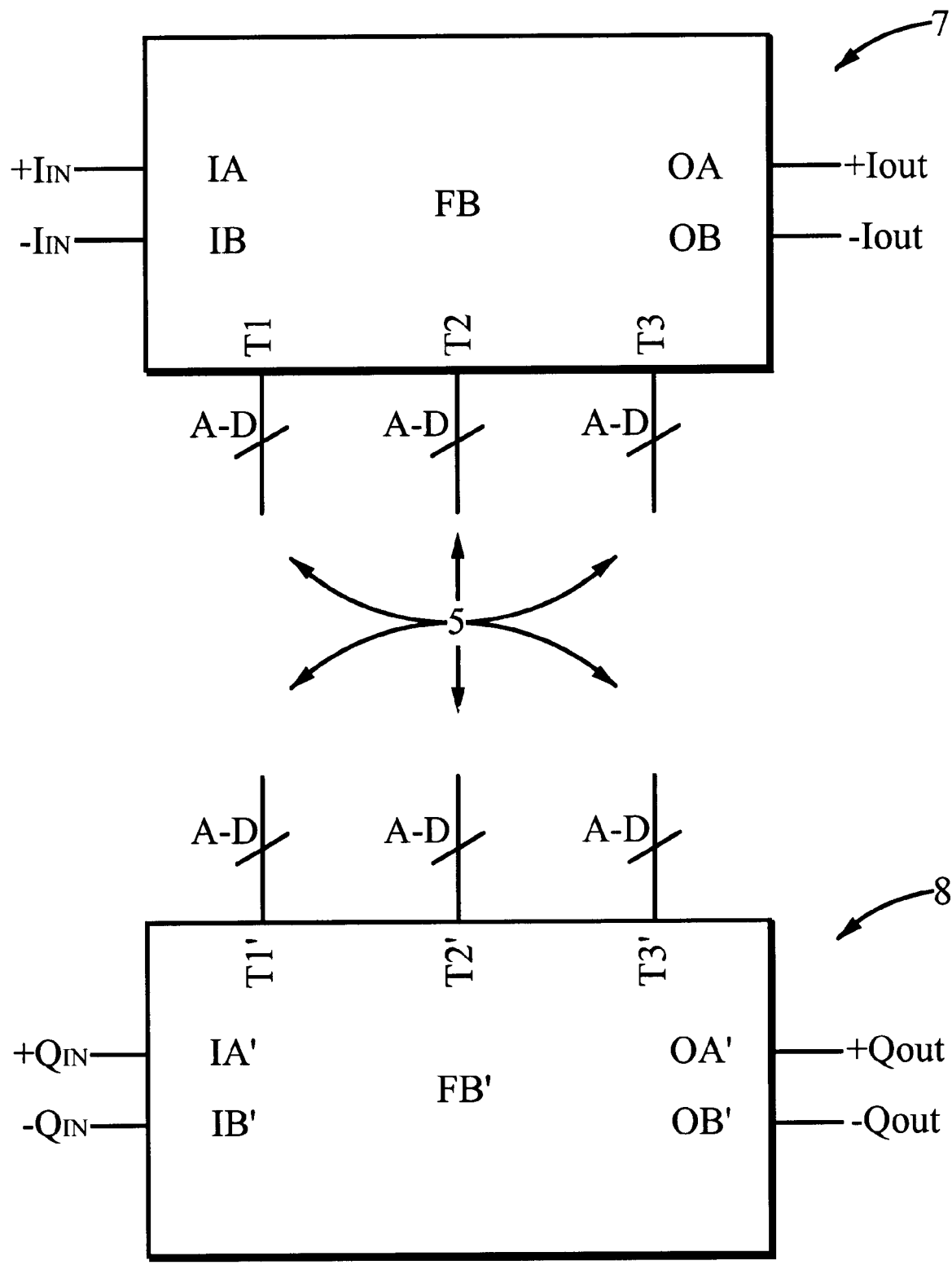
FIG. 2A illustrates a low-pass third-order quadrature filter constructed from two of the low-pass third-order active-RC filter blocks shown in FIG. 1C.
Figure 2B:
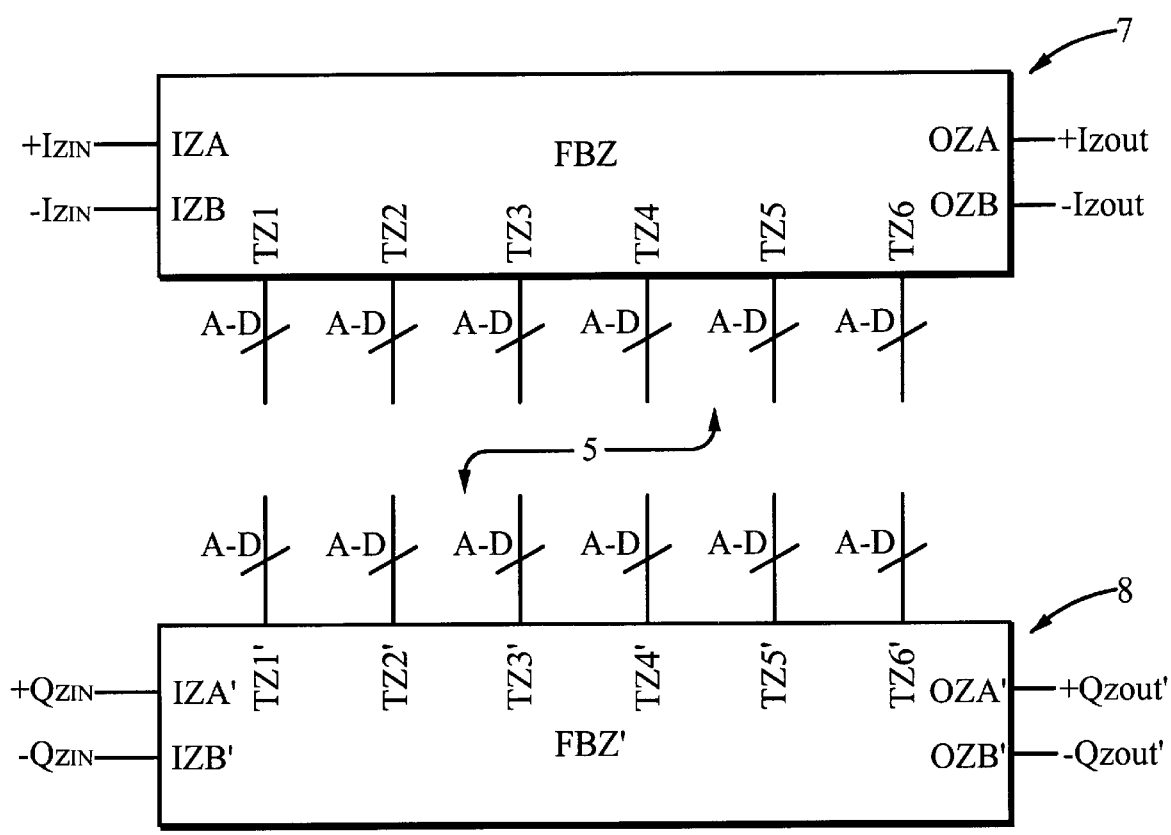
FIG. 2B illustrates a low-pass sixth-order quadrature filter constructed from two of the low-pass sixth-order active-RC filter blocks shown in FIG. 1F.
Figure 3A:
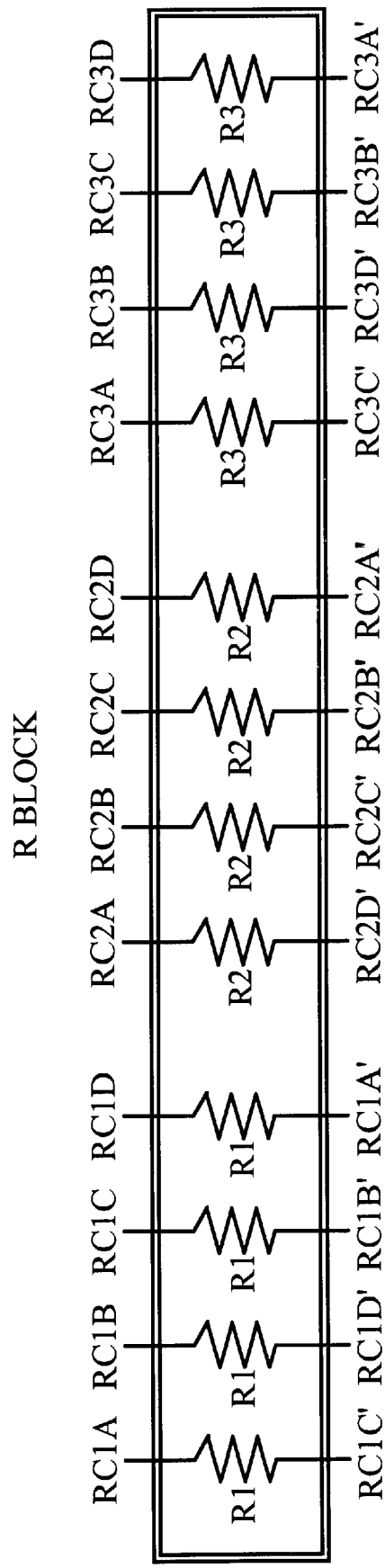
FIG. 3A shows the nodal connections for the R block.
Figure 3B:
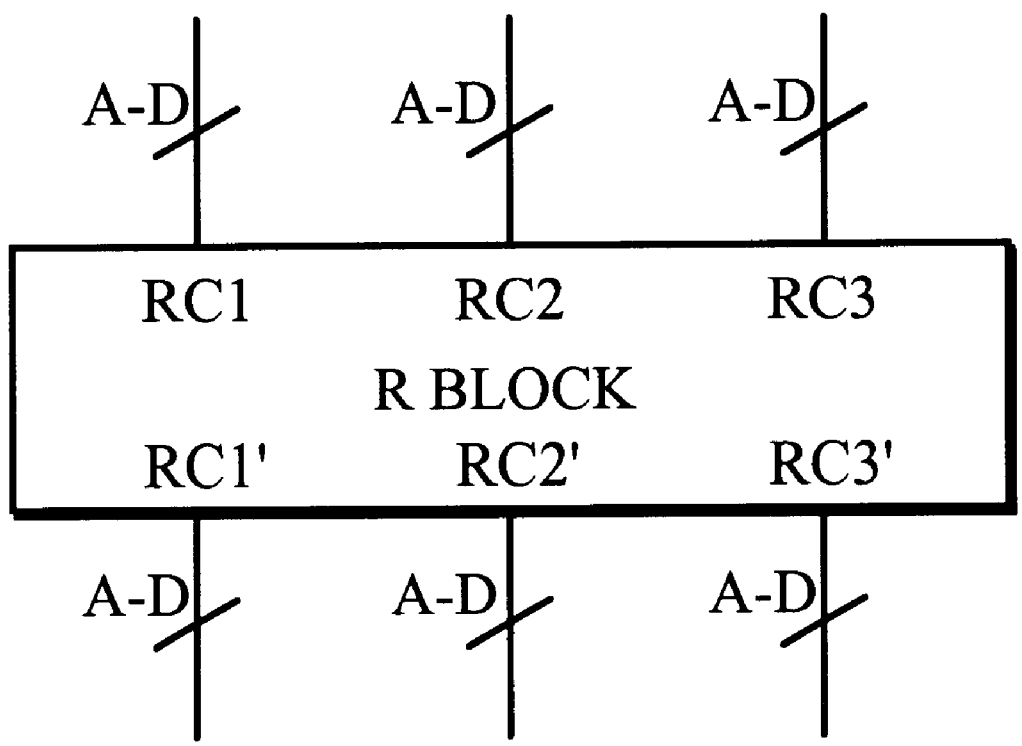
FIG. 3B shows the block diagram of the R block.
Figure 3C:
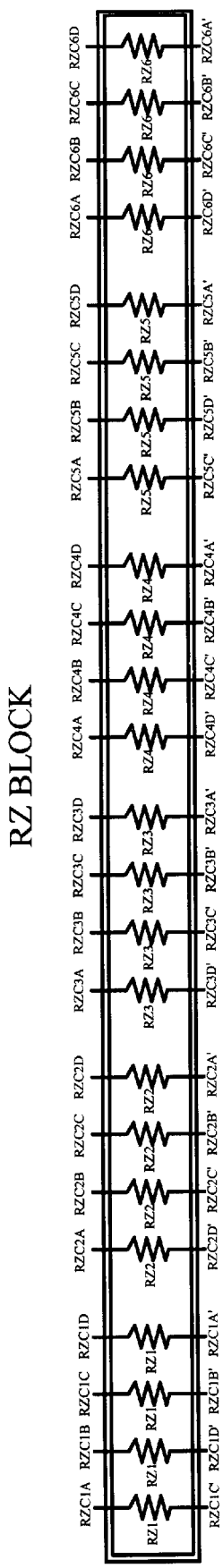
FIG. 3C shows the nodal connections for the RZ block.
Figure 3D:
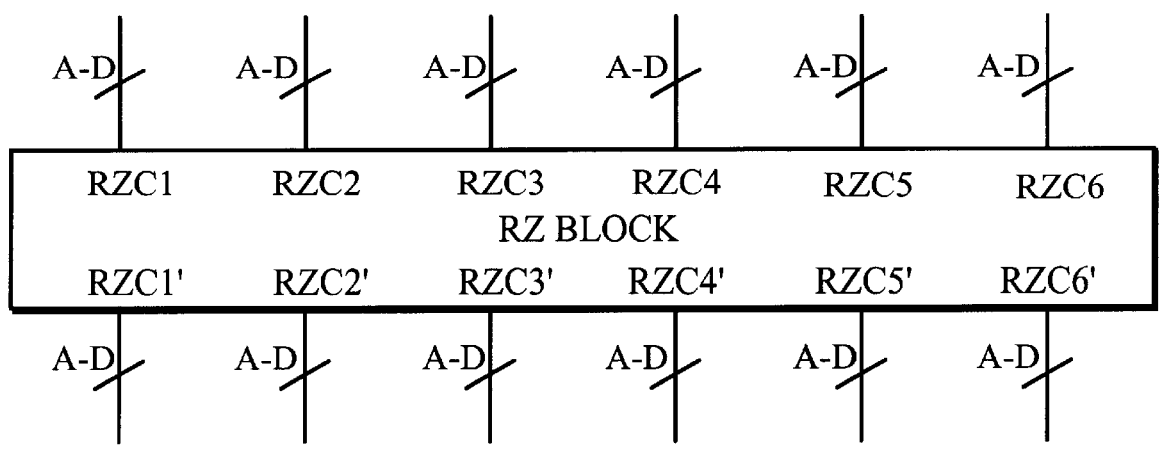
FIG. 3D shows the block diagram of the RZ block.
Figure 4A:
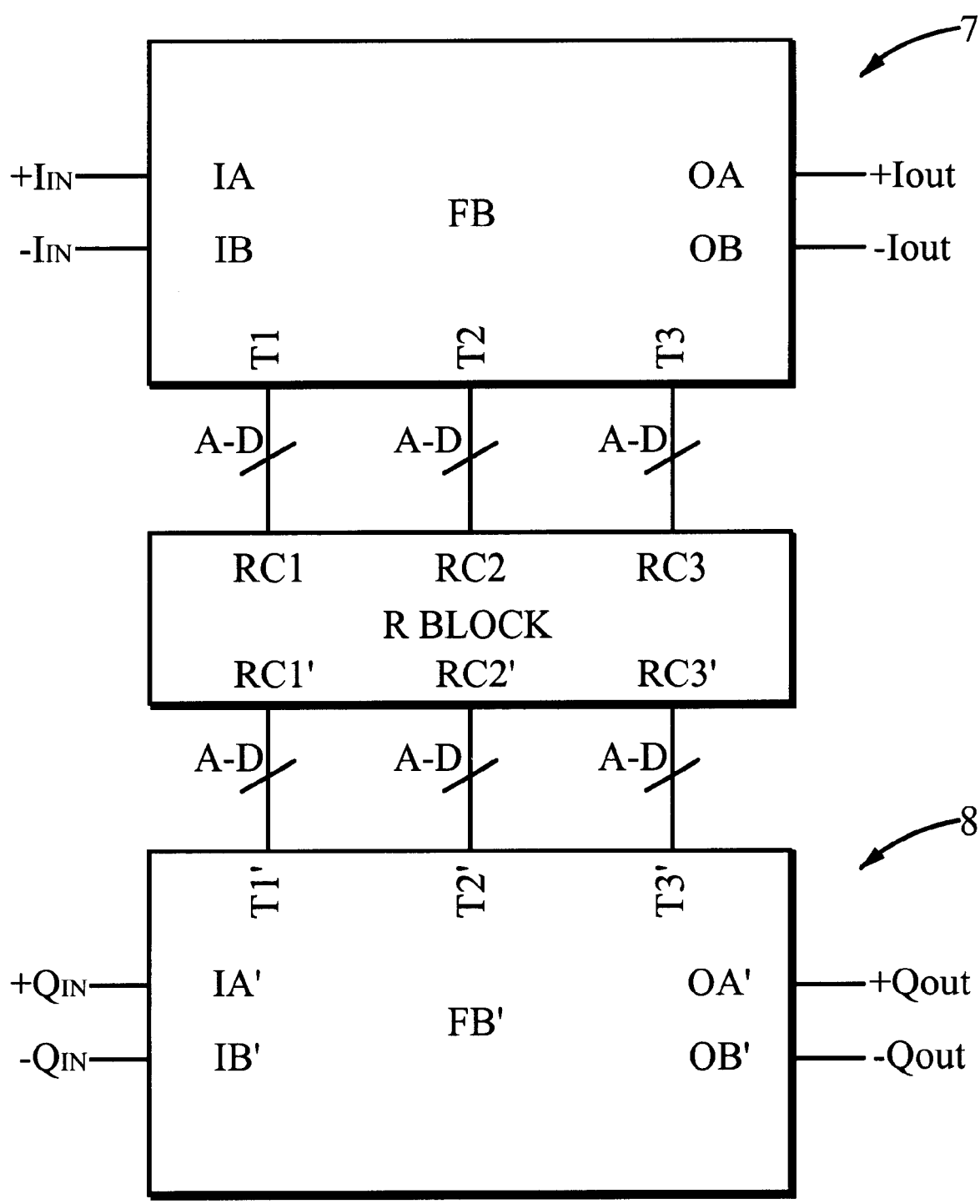
FIG. 4A shows a band-pass sixth-order quadrature filter constructed from two low-pass third-order active-RC filters coupled together by one R block.
Figure 4B:
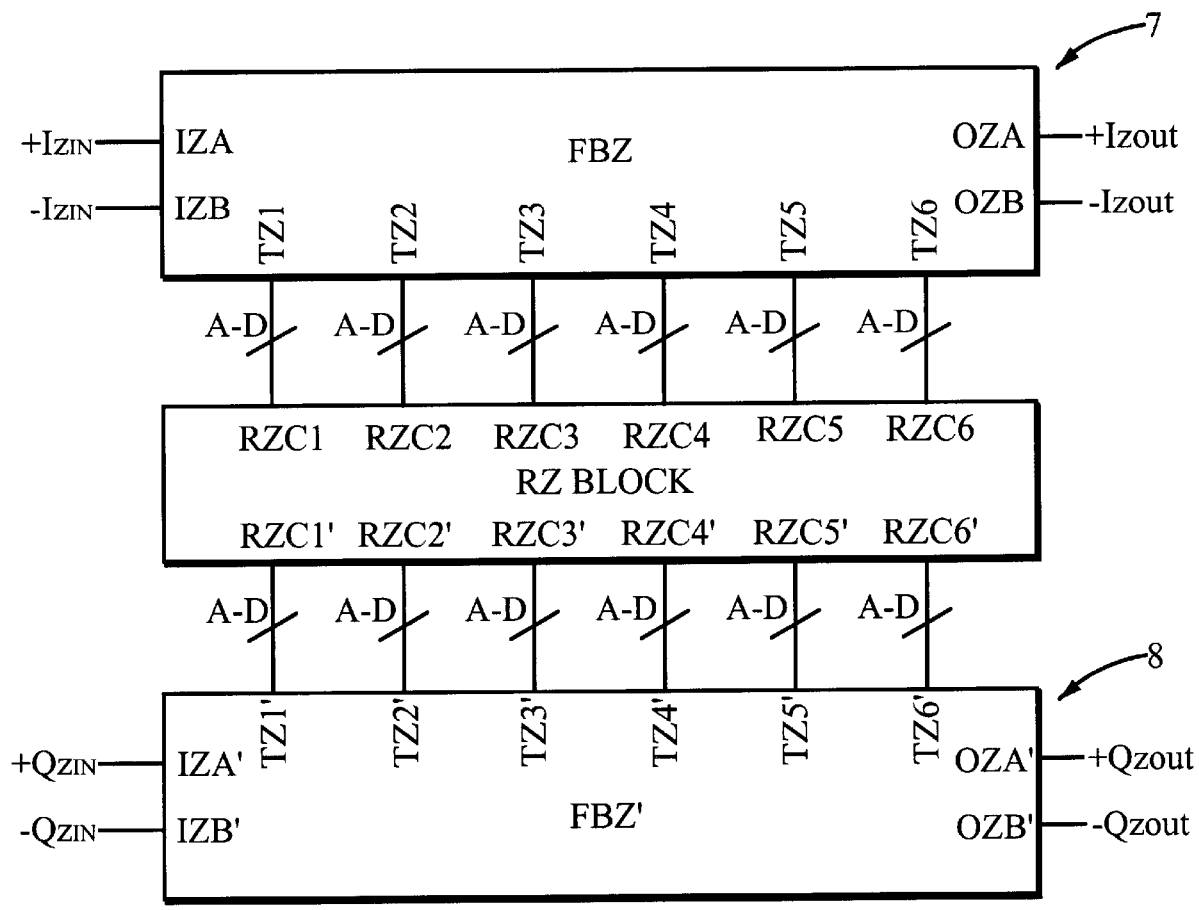
FIG. 4B shows a band-pass twelfth-order quadrature filter constructed from two low-pass sixth-order active-RC filters coupled together by one RZ block.
Figure 6A:
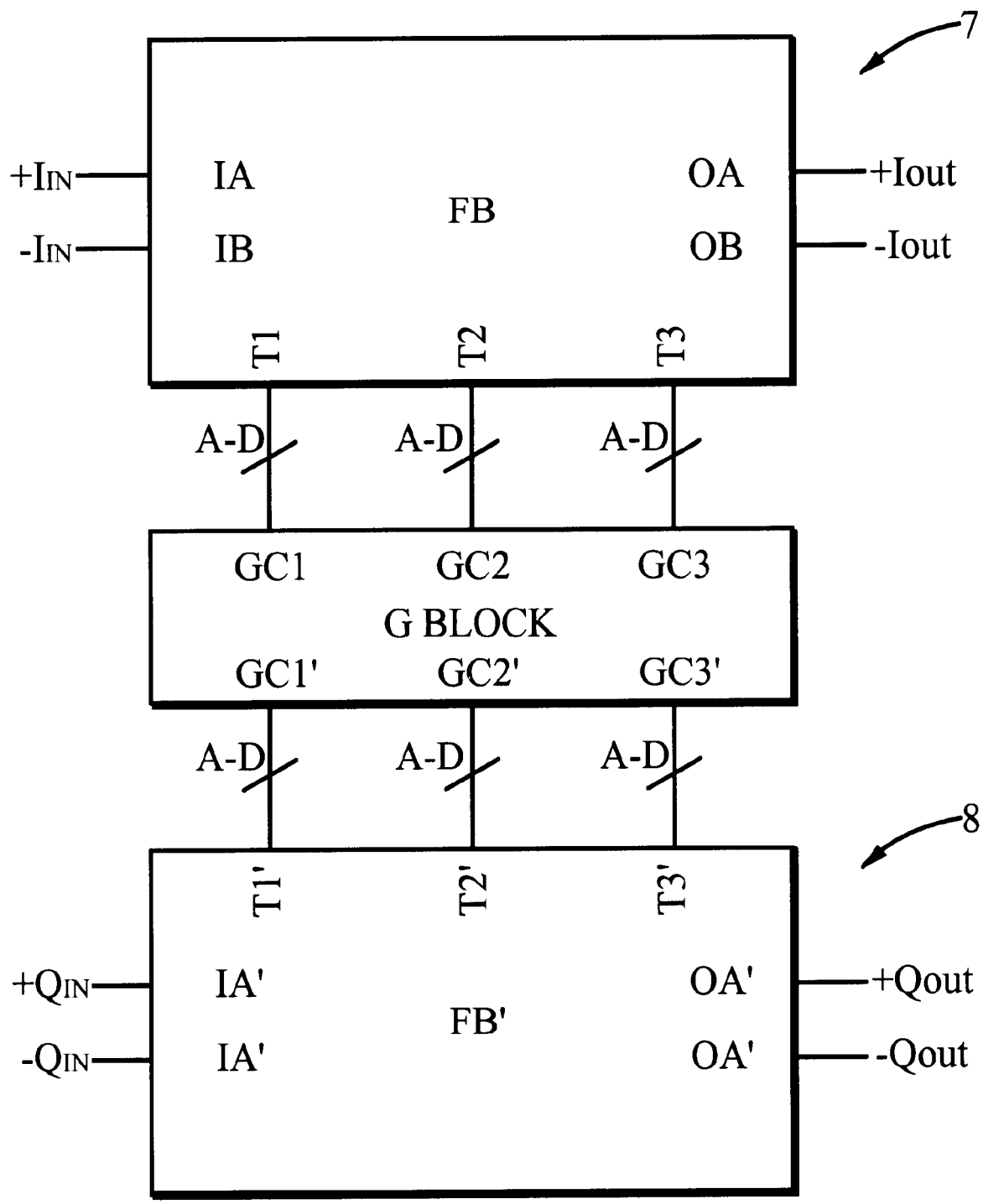
FIG. 6A shows a band-pass sixth-order quadrature filter constructed from two low-pass third-order active-RC filters coupled together by one G block.
Figure 6B:
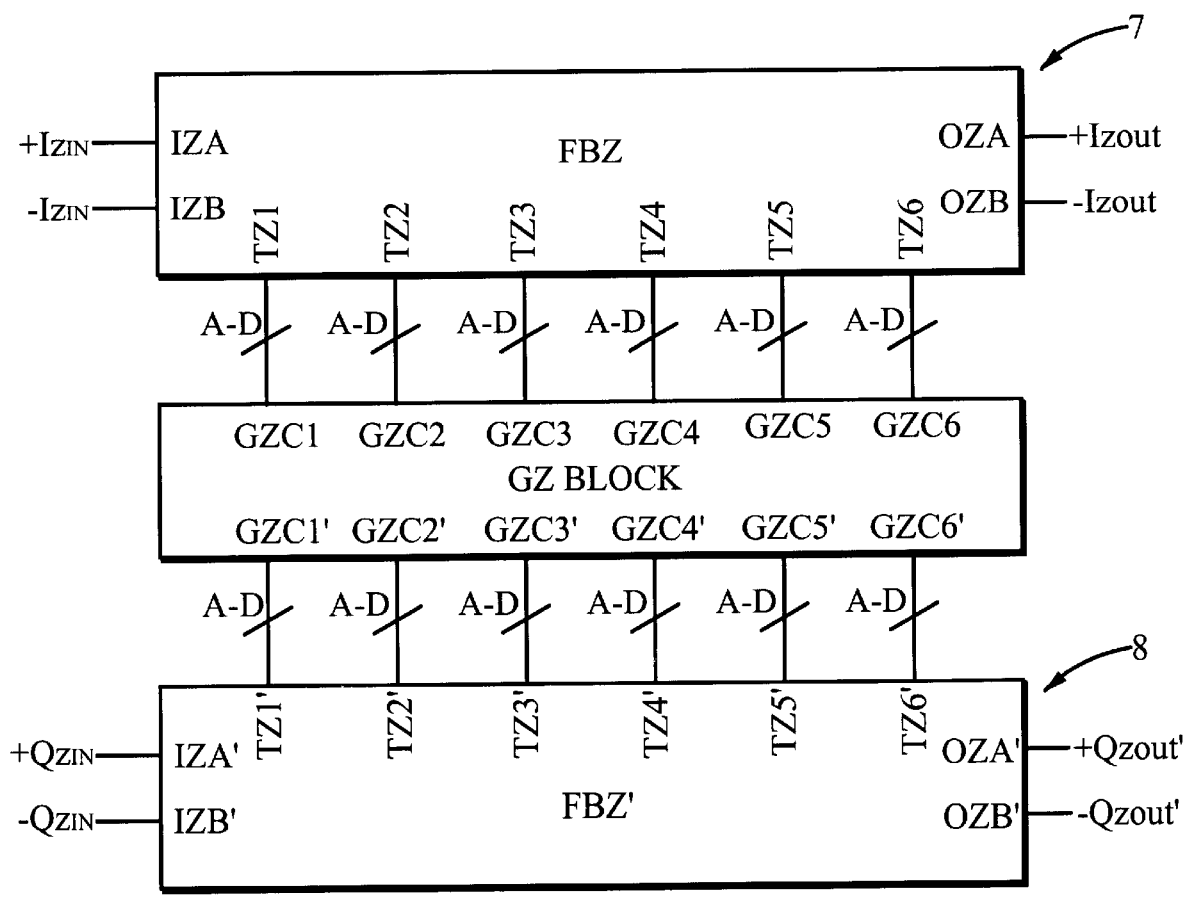
FIG. 6B shows a band-pass twelfth-order quadrature filter constructed from two low-pass sixth-order active-RC filters coupled together by one GZ block.

FIGS. 6A shows a first filter section 7 and a second filter section 8 coupled together through an G block. Excluding the addition and coupling of the G block, FIG. 6A shows the same quadrature filter configuration as in FIG. 2A. Corresponding G block leads are connected to the terminals of the first filter section 7 and the second filter section 8. GC1A and GC1A', for instance, are connected to T1A and T1A' respectively. The coupling of the first filter section 7 to the second filter section 8 in FIG. 6B follows the same method as FIG. 6A, except that the GZ block is used to couple FBZ and FBZ'.

The present invention has the advantage of reducing imbalances between filter section from common mode voltage and DC offset of each filter section's operational amplifier 2 outputs. In contrast, in the prior art arrangement of FIGS. 1–4, differences in the common mode voltage or DC offset of pair reactances can result in currents across the cross coupling resistors that are larger or smaller than expected. As current magnitudes stray from the desired theoretical values, the transfer function of the active-RC filter can be altered unpredictably. As used in the present invention, Gm cells are unaffected by mismatched common mode voltages and mismatched DC offsets. Unlike the prior art arrangement, the Gm cell current is not based upon the voltage potential between a first filter section 7 node and a second filter section 8 node. The output current of a Gm cells is based upon the differential input from the output pair of one balanced operational amplifier of one filter section. The common mode and DC offset voltages, therefore, are subtracted out.

The present invention also permits the center frequency of the quadrature filter to be field adjustable. Unlike an integrated resistor or capacitor, the conductance value of the Gm cells can be easily adjusted in the field by electronic means. The center frequency of the quadrature filter is equal to the transconductance value of a matched pair divided by its associated capacitance value. By altering the transconductance value electronically, the center frequency of the quadrature filter can be moved at will to a selected frequency. A field adjustable center frequency means that components can be tuned after manufacturing or being placed in service. A field adjustable architecture also allows the manufacturer to make one part for applications requiring different center frequencies or for applications requiring center frequencies adjustable during operation of the end-user device.

Using the present invention, it is possible to individually transform each reactance in a filter. The transformation can take place by scaling each resistance associated with a reactance in a filter by a scaling factor and by likewise scaling each capacitance and the associated Gm by the inverse of the scaling factor. Using such a transformation maintains the reactance. The transformation can be performed to optimize the signal handling capability of the filter. The transformation can also be performed to allow the selection of more convenient values for resistors and capacitors. Considering FIG. 5A, the reactance labeled X1 can be transformed by scaling its resistors R and the associated resistors R1 by a scaling factor. The capacitors C1 for this reactance are scaled by the inverse of the scaling factor. Also the Gm of the transconductor 13 is scaled by the inverse of the scaling factor.

The present invention has been described in terms of specific embodiments incorporating details to facilitate the understanding of principles of construction and operation of the invention. References to specific embodiments and details of the invention are not intended to limit the scope of the appended claims. It will be apparent to those skilled in the art that modifications may be made in the illustrated embodiment without departing from the spirit and scope of the invention. Specifically, it will be apparent to those skilled in the art that while the preferred embodiment of the present invention is used with third-order and sixth-order low-pass gaussian 2-phase filter sections, the present invention could also be implemented on other types of filters, filters sections of different orders, or filters section of more than two phases.

We claim:

1. An active polyphase filter with transconductor cross-coupling of filter sections, comprising:
   a. first to fourth inputs for applying a 4-phase input signal comprising first to fourth signal vectors, respectively, which succeed one another inphase by 90 degrees;
   b. first to fourth outputs;
   c. a first filter section comprising:
      i) X-reactances wherein:
         (1) each of the X-reactances are active balanced integrating circuits having one reactance input pair and one reactance output pair; and (2) each of the X-reactances are coupled to the first input, the third input, the first output, and the third output; and ii) M-terminals selectively coupled to reactance input pairs of the first filter section and reactance output pairs of the first filter section;

d. a second filter section comprising:
i) Y-reactances wherein:
(1) each of the Y-reactances are active balanced integrating circuits having one reactance input pair and one reactance output pair; and
(2) each of the Y-reactances are coupled to the second input, the fourth input, the second output, and the fourth output; and ii) N-terminals selectively coupled to reactance input pairs of the second filter section and reactance output pairs of the second filter section; and e. Z-transconductor pairs cross-coupling the reactances of the first filter section through the M-terminals and the reactances of the second filter section through the N-terminals.

2. The active polyphase filter with transconductor cross-coupling of filter sections according to claim 1, wherein:
a. of the M-terminals:
i) one half of the M-terminals are coupled to reactance input pairs of the first filter section; and
ii) the other half of the M-terminals are coupled to reactance output pairs of the first filter section;
b. of the N-terminals:
i) one half of the N-terminals are coupled to reactance input pairs of the second filter section; and
ii) the other half of the N-terminals are coupled to reactance output pairs of the second filter section; and
c. of the Z-transconductor pairs:
i) each of the transconductors have one transconductor input pair and one transconductor output pair; and
ii) in each Z-transconductor pair:
(1) one transconductor is coupled by its:
(a) transconductor input pair to a reactance output pair of a corresponding X-reactance through a selected pair of M-terminals; and
(b) transconductor output pair to a reactance input pair of a corresponding Y-reactance through a selected pair of N-terminals; and
(2) the other transconductor is coupled by its:
(a) transconductor input pair to a reactance output pair of a corresponding Y-reactance through a selected pair of N-terminals; and
(b) transconductor output pair to a reactance input pair of a corresponding X-reactance through a selected pair of M-terminals.

3. The active polyphase filter with transconductor cross-coupling of filter sections according to claim 1, wherein the transconductors are active balanced Gm cells.

4. The active polyphase filter with transconductor cross-coupling of filter sections according to claim 1, wherein the transconductance of at least one transconductor is filed adjustable.

5. The active polyphase filter with transconductor cross-coupling of filter sections according to claim 1, wherein:
a. the first filter section and the second filter section are both third-order low-pass two-phase gaussian filters; and
b. the value of:
i) X and Y are equal;
ii) M and N are equal; and
iii) M is equal to four times the value of X.

6. The active polyphase filter with transconductor cross-coupling of filter sections according to claim 1, wherein:
a. the first filter section and the second filter section are both sixth-order low-pass two-phase gaussian filters; and
b. the value of:
i) X, Y and Z are equal;
ii) M and N are equal; and
iii) M is equal to four times the value of X.

7. The active polyphase filter with transconductor cross-coupling of filter sections according to claim 1, wherein:
a. the active balanced integrating circuits are comprised of:
i) a balanced differential amplifier coupled between the reactance input pair and the reactance output pair; and
ii) a matched capacitor pair, wherein:
(1) one matched capacitor is shunted between:
(a) the first input of the reactance input pair; and
(b) the first output of the reactance output pair; and
(2) the other matched capacitor is shunted between:
(a) the second input of the reactance input pair; and
(b) the second output of the reactance output pair;
b. the matched capacitors of the first to Xth reactance and the corresponding matched capacitors of the first to Yth reactance are of equal capacitance; and
c. the transconductance of each transconductor pair is set as the product of:
i) a desired radian center frequency; and
ii) the capacitance of the nearest matched capacitors coupled to the transconductor pair.

8. An active filter comprising:
a. a first filter section having a first plurality of reactances;
b. a second filter section having a second plurality of reactances wherein the first and second plurality of reactances include equal numbers;
c. a plurality of pairs of transconductors, each pair corresponding to one of the first plurality of reactances and to one of the second plurality of reactances, a first transconductor of each pair having a pair of inputs coupled to the corresponding one of the first plurality of reactances and a pair of outputs coupled to the corresponding one of the second plurality of reactances and a second transconductor of each pair having a pair of inputs coupled to the corresponding one of the second plurality of reactances and a pair of outputs coupled to the corresponding one of the first plurality of reactances.

9. The active filter according to claim 8 wherein each transconductor is a balanced Gm cell.

10. The active filter according to claim 8 wherein each reactance of the first and second plurality of reactances includes a differential amplifier having capacitive feedback.

11. The active filter according to claim 8 wherein each reactance of the first and second plurality of reactances includes a balanced integrator.

12. The active filter according to claim 8 wherein the active filter is a quadrature polyphase filter.

13. The active filter according to claim 8 wherein the active filter is a third order filter.

14. The active filter according to claim 8 wherein the active filter is a sixth order filter.

* * * * *